United States Patent [19]

Hammerbacher et al.

[11] Patent Number: 5,466,301

[45] Date of Patent: Nov. 14, 1995

[54] SOLAR CELL HAVING AN OUTPUT-INCREASING, PROTECTIVE COVER

[75] Inventors: Milfred D. Hammerbacher, Dallas; Russell R. Schmit, Plano, both of Tex.

[73] Assignee: Texas Instruments Incorporated, Dallas, Tex.

[21] Appl. No.: 267,633

[22] Filed: Jun. 29, 1994

[51] Int. Cl.[6] ............... H01L 31/048; H01L 31/052; H01L 31/0384; H01L 31/18
[52] U.S. Cl. ............ 136/246; 136/250; 136/251; 437/2; 437/212; 437/216
[58] Field of Search ................... 136/246, 250, 136/251; 437/2–5, 212, 216

[56] References Cited

U.S. PATENT DOCUMENTS

| | | | |
|---|---|---|---|
| 3,025,335 | 3/1962 | Ralph | 136/250 |
| 3,040,416 | 6/1962 | Matlow et al. | 136/250 |
| 3,998,659 | 12/1976 | Wakefield | 136/250 |
| 4,407,320 | 10/1983 | Levine | 136/250 |
| 4,521,640 | 6/1985 | Levine | 136/250 |
| 4,581,103 | 4/1986 | Levine et al. | 156/659.1 |
| 4,582,588 | 4/1986 | Jensen et al. | 205/124 |
| 4,806,495 | 2/1989 | Levine et al. | 437/2 |
| 4,872,607 | 10/1989 | Jensen et al. | 228/180.1 |
| 4,917,752 | 4/1990 | Levine et al. | 156/292 |
| 4,957,601 | 9/1990 | Levine et al. | 156/665 |
| 5,028,546 | 7/1991 | Hotchkiss | 437/2 |
| 5,086,003 | 2/1992 | Hammerbacher | 437/2 |
| 5,091,319 | 2/1992 | Hotchkiss et al. | 437/2 |
| 5,192,400 | 3/1993 | Parker et al. | 205/124 |

*Primary Examiner*—Aaron Weisstuch
*Attorney, Agent, or Firm*—Robert C. Klinger; James C. Kesterson; Richard L. Donaldson

[57] ABSTRACT

A flexible cover (14) for a flexible solar cell (12) protects the cell from the ambient and increases the cell's efficiency. The cell (12) includes silicon particles (16) held in a flexible aluminum sheet matrix (20,22). The cover (14) is a flexible, protective layer (60) of a light-transparent material such as a fluoropolymer, preferably TEFZEL® film having a relatively flat upper, free surface (64) and an opposed surface (66) coated with an adhesive, preferably EVA. The surface (66) is applied to the particles (16) so as to include first portions (68) which conform to the poles (31 P) and the polar regions (31R) of the particles (16) and second, projecting convex (72) or concave (90) prism-like portions which define spaces (78) in conjunction with the reflective surface (20T) of one aluminum sheet (20). Without the cover (14), light (50) falling on the surface (20T) between the particles (16) is wasted, that is, it does not fall on a particle (16). The surfaces of the second portions (72,90) are non-parallel to the direction of the otherwise wasted light (50), which, together with a selected relationship between the refractive indices of the cover 14 and the spaces (78), results in sufficient diffraction of the otherwise wasted light (50) so that about 25% of it is reflected from the surface (20T) onto a particle (16).

44 Claims, 3 Drawing Sheets

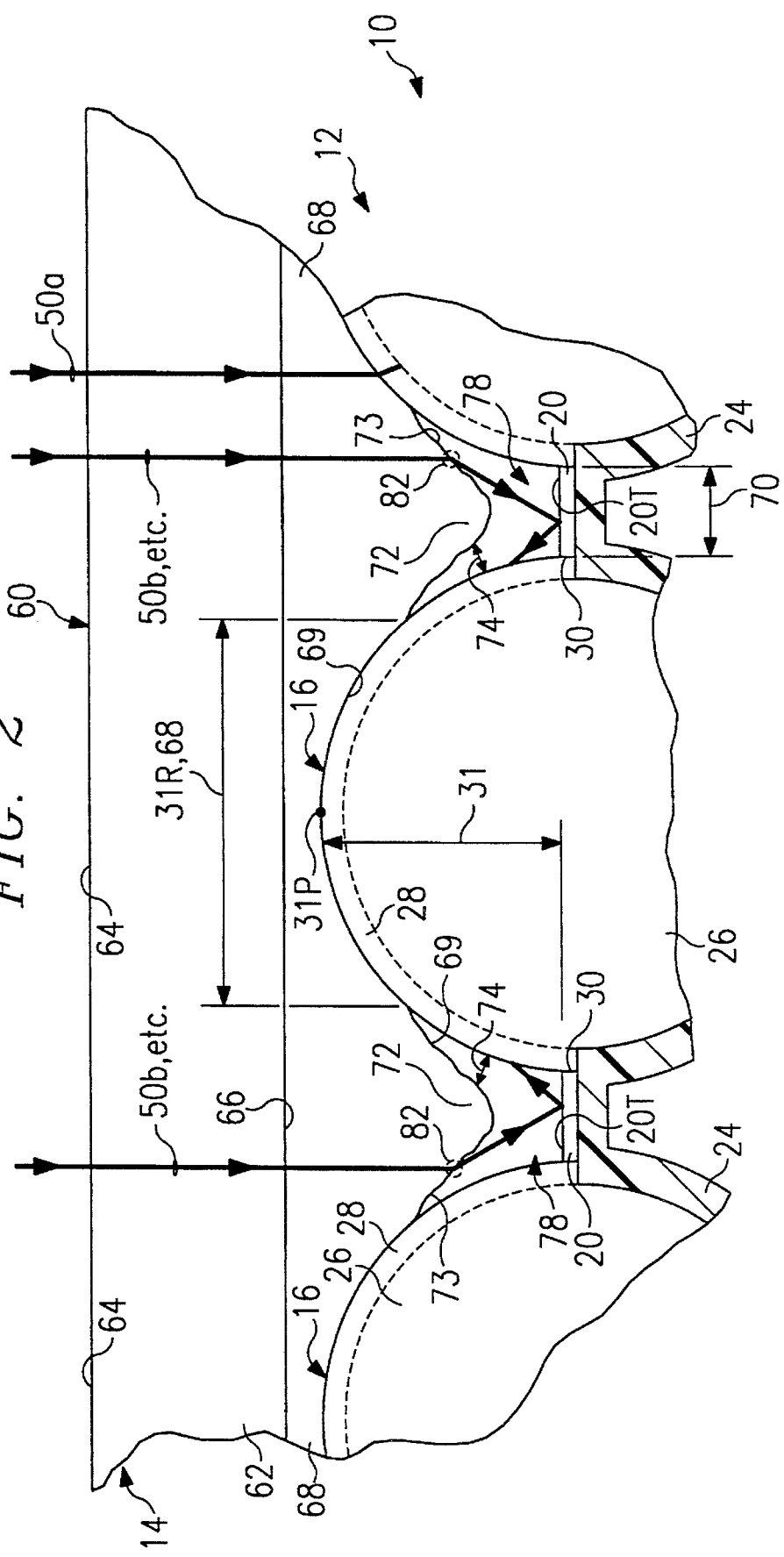

SOLAR CELL HAVING AN OUTPUT-INCREASING, PROTECTIVE COVER

RELATED APPLICATION

This application is related to commonly assigned U.S. patent application, Ser. No. 08/212,542, filed Mar. 14, 1994.

BACKGROUND OF THE INVENTION

The present invention relates to a protective cover for a solar cell, and, more particularly, to an output-increasing, protective cover for a solar cell.

Various types of photovoltaic ("PV") devices such as solar cells, for converting radiant energy, such as sunlight, into electricity are known. One type of solar cell which is of particular current interest comprises a plurality of spaced particles or members, typically spherical or spheroidal particles, supported by a conductive sandwich which includes first and second conductive sheets separated by an insulative coating. Each sphere is a semiconductor, for example silicon having a P-type interior and an N-type exterior or skin.

The first sheet is a thin, flexible metallic foil, typically aluminum, with a plurality of spaced cell-retaining apertures formed therethrough, for example, by an emboss-then-etch or stamping process. The apertures may define a regular geometrical pattern which preferably comprises overlapping hexagons. This pattern permits maximum packing of the apertures, and, hence, of the spheres. The spheres are placed on a top surface of the first foil and, by the use of negative pressure and doctoring techniques, each aperture ultimately has one sphere nested therein. Thereafter, heat and pressure are applied to the cell sandwich to move the nested spheres partially into and through the apertures. This movement effects the interaction of the aperture walls with the spheres to locally remove the native aluminum and silicon oxides so that the abutting aluminum mechanically bonds directly to, and forms an electrical contact with, the N-type exterior of the silicon spheres, thereby affixing the spheres to the first foil.

The affixing of the spheres to the first foil results in an upper light-gathering portion of each sphere protruding or extending above the top surface of the first foil and a lower portion of each sphere protruding below a lower surface of the first foil. The N-type exterior is removed from the cells below the first foil's lower surface. The lower foil surface and the exposed P-type interior of the lower sphere portions are then coated with a flexible, electrically insulative coating, typically a polyamide. The insulative coating on the spheres is then treated to remove some of the coating to thereby expose the P-type interior of each sphere through so-called vias. Following via formation, the second foil, preferably flexible aluminum, is electrically connected to the P-type interiors of the spheres through the vias. The flexible solar cell so formed may power utilization devices connected between the foils.

The foregoing and similar solar cells and techniques for producing them are disclosed in the following commonly assigned U.S. Pat. Nos.: 4,407,320; 4,521,640; 4,581,103; 4,582,588; 4,806,495; 4,872,607; 4,917,752; 4,957,601; 5,028,546; 5,192,400; 5,091,319; and 5,086,003.

The above-described solar cells comprise a plurality of miniature PV devices—the spaced silicon or other semiconductive members, spheres, spheroids or other particles—connected in electrical parallel via the first and second foils. The foils, therefore, are connectable to a utilization device or circuit for electrical energization thereof when the cells are exposed to radiant energy. The cells are flexible and may be formed into various non-planar configurations, either free-standing or conforming to an irregular underlying surface.

While solar cells constructed as set forth above are mechanically robust, protecting them from the deleterious effects of the environment and ambient conditions is generally thought to be prudent. For example, water in the form of rain or other precipitation, in prolonged direct contact with the spheres or other particles or the foils can cause oxidation and corrosion, giving rise to mechanical and/or electrical degradation of the cell. Pollutants may also deleteriously affect the cell, such as by attacking the spheres or foil of the cell or by decreasing or preventing radiant energy from reaching the particles or spheres.

For the foregoing and other reasons, it is typical to cover, encapsulate or otherwise house solar cells to protect them against ambient-caused degradation. Such protective measures viewed in the context of prior art non-flexible solar cells have often taken the form of rigid "picture frames" having a transparent cover which surrounds the solar cell to isolate it from the ambient. The cover, of course, permits sunlight and other radiation to reach the cells where it is converted to electricity. Such picture fame covers are not flexible and limit the range of uses to which the flexible cells of the above patents may be put.

The upper portion of each particle or sphere—typically an N-type silicon hemisphere—functions as a spherical lens. That is, this upper portion gathers light incident on the particle or sphere and directs this light onto the particle's or sphere's P-N junction. These spherical lenses are able to direct to the P-N junction only that light which is directly incident on the particles or spheres. Some of the light which is incident on the top surface of the first foil between the particles or spheres—that is, light which "misses" the particles or spheres—is, in effect, "wasted" and is not effective to produce electricity, because it does not reach the P-N junction of the spheres, and is, instead, back-reflected to the ambient.

Commonly assigned U.S. patent application, Ser. No. 08/060,773, filed May 11, 1993 (now U.S. Pat. No. 5,419,782) discloses a flexible protective cover with an undulating free surface which comprises a coating having particle-conformal portions which extend into the spaces between adjacent particles. The portions of the coating conforming to each particle act as lenses, directing otherwise "wasted" light—light which would fall on the first foil between adjacent particles for reflection back along its incoming path—onto the underlying particle. While this cover achieves solar cell efficiency increases of about 10%–20% (for a given amount of radiant energy incident on the cell), dirt and pollution-borne contaminants can be difficult to remove from its undulating irregular free surface.

Commonly assigned U.S. patent application, Ser. No. 08/212,542, filed Mar. 14, 1994 discloses another cover for a similar photovoltaic cell. The cover includes a layer of radiant-energy transparent material having a free or upper surface and an opposed surface. The opposed surface is irregular. This irregularity results from the opposed surface conforming to the polar or upper regions of the particle portions and being configured into prism-like cusps, extensions, projections or deformations between adjacent particles. The cusps approach, but do not contact the reflective surface. The resulting spaces, gaps or volumes between the cusps and the reflective surface may contain a substance, such as air, other gases, a liquid, a polymer of a different index of refraction, or may be evacuated. The material between adjacent particles—that is, the bottoms of the cusps—may be concave or convex as viewed from the reflective surface.

The configuration of the cusps and the refractive indices of the layer and the resulting spaces are related and cooperate so that a significant amount of the radiant energy which passes through the layer between adjacent particles—which radiant energy, as noted above, would be otherwise "wasted"—is refracted at the cusp-space interface and is then reflected by the reflective surface onto the particle portions. Specifically, refraction causes the radiant energy to impinge on and to be reflected from the reflective surface in a non-perpendicular manner. The non-perpendicularity of the reflection directs the energy onto the particle portions. The cover may increase cell efficiency up to 25% as it protects the cell from harm caused by the ambient.

SUMMARY OF THE INVENTION

The present invention contemplates an improved form of the invention disclosed in the Ser. No. 08/212,542 application. Specifically, the present invention contemplates a cover for solar cells which encapsulates and protects the cells from the ambient and which directs onto the particles or spheres a significant amount of the otherwise "wasted" light incident on the solar cells. The general structure and method of producing the flexible cover of the present invention is as set forth in the Ser. No. 08/212,542 application, with the radiant-energy-transparent layer being a fluropolymer having the surface opposed to the free surface coated with an ethylene vinyl acetate adhesive. A preferred material for the layer is TEFZEL® film available from duPont. The present invention also contemplates a flexible cover having the foregoing characteristics which permits the forming of flexible solar cells capable of assuming non-planar configurations, as well as methods for producing the aforenoted cover.

BRIEF DESCRIPTION OF THE DRAWING

The Figures depicting the present invention are exaggerated, are not to scale and are configured only to illustrate the principles of the present inventions.

FIG. 2 is similar to FIG. 1 and illustrates a solar cell fragment on a part of which there is a cover according to the principles of the present invention;

DETAILED DESCRIPTION

Figure 1:
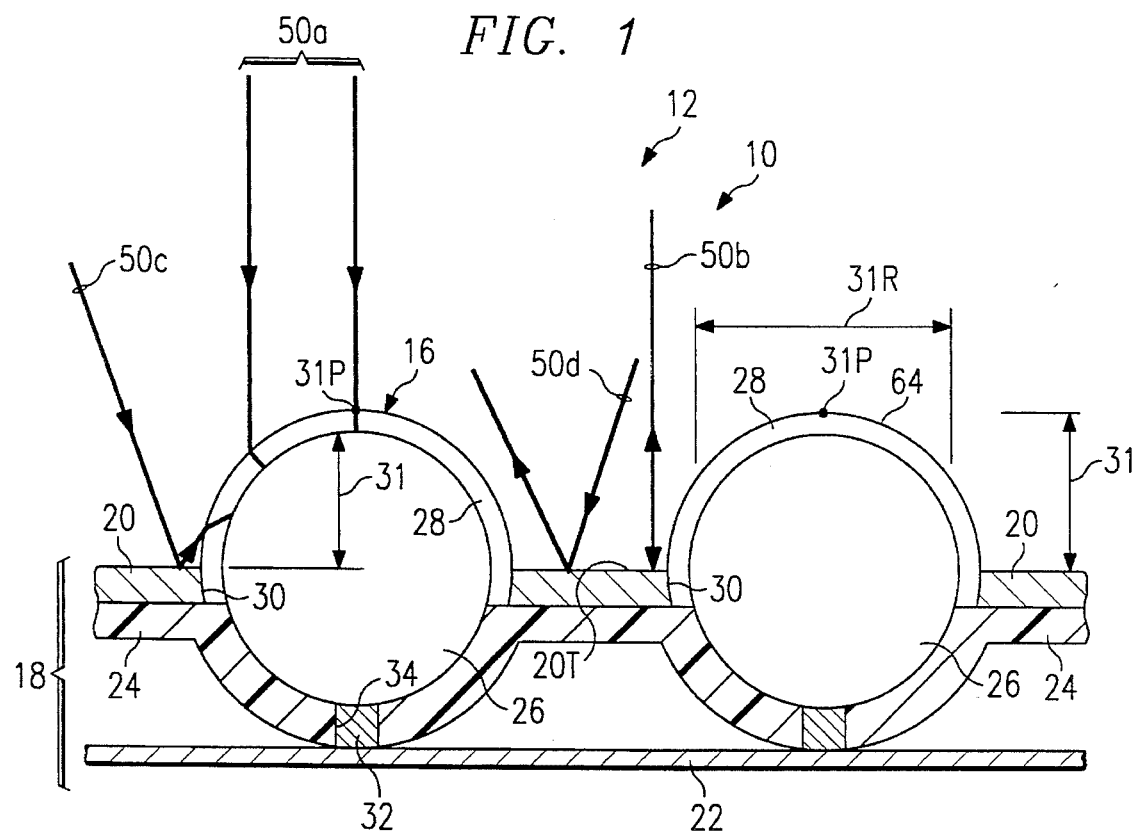
FIG. 1 is a sectioned front elevation of a fragment of a solar cell.

Referring to FIGS. 1 and 2 there are shown sectioned elevational views of fragments 10 of a solar cell 12. In FIG. 2 the solar cell 12 is protected by a cover 14 according to the present invention, while the solar cell 12 of FIG. 1 is not so protected.

The cell 12 may include a plurality of spaced semiconductive particles or members 16, which are preferably spheres or spheroids having diameters of about 25–45 mils and typically constituted of silicon, affixed to a conductive sandwich 18. Adjacent particles or spheres 16 are typically spaced apart by 1–4 mils. The conductive sandwich 18 may include a first or upper metallic foil 20 and a lower or second metallic foil 22 separated by an intervening insulative coating 24. Both foils 20 and 22 are preferably flexible and may be fabricated from aluminum. The coating 24 is also preferably flexible and may be a polyimide. The flexibility of the foils 20,22 and the coating 24 results in the cell 12 being flexible and conformally or otherwise shapable.

The particles or spheres 16 include an interior portion 26 of one conductivity type, e.g., P-type, and an outer portion 28 of the opposite conductivity type, e.g., N-type. The particles or spheres 16 are affixed or mounted to the first foil 20 by locating them in apertures 30 formed therein, with the walls of the apertures 30 being mechanically and electrically connected to the N-type outer portions 28. An extending or upper portion 31 of each particle or sphere 16 extends away or protrudes above a first or top surface 20T of the first foil 20. The first surface 20T of the first foil 20 is typically reflective.

The extending portion 31 of each particle 16, whether or not it is a sphere, may be viewed as having a pole 31P and an upper, surrounding polar region 31R. The second foil 22 is mechanically and electrically connected to the interior portion 26 of each particle or sphere 16. To that end the outer portion 28 of each particle or sphere 16 below the first foil 20 is removed and the resulting exposed interior portion 26 of each sphere 16 and a second or lower surface of the first foil 20 are covered with the insulative coating 24. The second foil 22 electrically contacts metallic contacts 32 which engage the interior portions 26 of the spheres 16 and are positioned in vias or holes 34 formed through the insulative coating 24.

When light or other appropriate radiant energy 50 is perpendicularly or nearly perpendicularly—or, vertically or nearly vertically—incident on the cell 12, some of it 50a, as shown in FIG. 1, is directly incident on the extending or upper portions 31 of the particles or spheres 16, including the pole 31P and polar region 31R thereof. Some of the light 50 is incident on the first or top surface 20T of the first foil 20 between the adjacent particles or spheres 16. Since a substantial amount of the light 50b perpendicularly or vertically incident on the top foil surface 20T is perpendicularly reflected back away from the foil 20, little, if any, of this light 50b, ever reaches the particles or spheres 16. In typical cells 12, about 20% of the cell area comprises the regions of the first surface 20T between the adjacent particles or spheres 16. Thus, about 20% of the incident light 50 is "wasted." The upper portions 31 of the spheres 16, comprising the N-type silicon 28, function as spherical lenses to gather and direct the light 50a incident thereon onto the P-N junctions 26–28 of the spheres 16. Light incident on this junction 26–28 produces electricity which flows in the foils 20 and 22 for consumption by a utilization device or circuit.

As noted, a majority of the light 50 collected by the upper sphere portions 31 is the perpendicular/vertical or nearly perpendicular/vertical light 50a directly incident thereon. Some small amount of the light 50c non-perpendicularly incident on or reflected from the top foil surface 20T will, depending on its angle of incidence and proximity to a sphere 16, be collected by the spherical lens 31 thereof and directed to the P-N junctions 26–28, as shown to the left of the leftwardmost sphere 16. Most of the light 50 incident directly on the top foil surface 20T is either reflected away therefrom along its incident path, as shown at 50a for perpendicularly incident light, or is reflected away without striking a sphere 16, as shown at 50d to the right of the leftwardmost sphere 16 in FIG. 1. In effect, most of the light 50b, 50c, 50d not falling directly on the spheres 16 is "wasted," that is, it is not effective in the production of electricity by the particles or spheres.

Various elements and portions of the cell 12 may be damaged or otherwise adversely affected by the environment. Rain, other precipitation, particulate matter, pollutants and other contents of the ambient can corrode, etch, render opaque and otherwise damage the cell 12. In view of this, the prior art typically resorted to enclosing rigid solar cells in a picture frame-like structure with glass or other optically clear material overlying the upper sphere portions for protecting the cell 12 against environmental damage. The cover 14 according to the present invention protects the cell 12 against such environmental damage and increases the output of the cell 12 for a given amount of light 50 incident thereon. The cover 14 is also flexible, permitting the flexible cell 12 to be formed into various non-planar configurations.

The cover 14 shown in FIG. 2, directs much of this otherwise "wasted" light 50b, etc. onto the particles or spheres 16 and protects the cell 12 against the deleterious effects of the environment.

The cover 14 includes a radiant energy-transparent or optically clear layer 60 which absorbs little if any of radiation in the solar spectrum, defined herein to mean radiation having a wavelength within the approximate range of 0.4–1.1 micron. Radiation within this wavelength range is particularly effective in producing electricity at the P-N junction 26–28. Preferably, the layer 60 also resists the deleterious effects—such as embrittlement, cracking, warping or other deformation, loss of flexibility and clouding—of UV and high temperatures.

The layer 60 is flexible and conformable. In preferred embodiments, the layer 60 is a polymer or plastic film 62, preferably a fluoropolymer film, such as TEFZEL®, available from duPont, having a thickness of about 1½ mils. Other polymer materials such as acrylic and ethylene vinyl acetate have also been found suitable. For purposes of the present description, the layer 60 will be viewed as having a free or upper surface 64 and an opposed or second surface 66.

The opposed surface 66 of the layer 60 is coated or covered with an adhesive 68. The adhesive 68 is transparent to the radiation to which the layer 60 is transparent. Preferably, the adhesive 68 is ethylene vinyl acetate ("EVA") having an thickness of 3 mils between the surface 66 and the free surface 69 of the adhesive which is substantially planar before the film 62 is adhered to a surface or surfaces.

The film 62 is first placed on top of the particles or spheres 16 with the free surface 69 of the adhesive 68 in contact with the poles 31P thereof. The cover 14 is adhered to the cells 12 and the free surface 69 of the adhesive 68 is rendered irregularly configured to achieve two results.

First, the free surface 69 is urged against the poles 31P and the polar regions 31R of the extending or upper portions 31 of the particles 16. In this manner the free surface 69 becomes conformal with the polar regions 31R, as indicated at 68. Second, the adhesive 68 is extruded or forced into the separation 70 between adjacent particles 16 so that, within each separation 70, the free surface 69 is configured as a prism-like cusp, projection or similarly shaped extension 72. The adherence of the cover 14 to the cells 12 and the formation of the cusps or projections 72 may be effected or aided by the application of force and/or heat to the cover 14.

In FIG. 2, walls 73 of the projections 72 are convexly configured. Each cusp or prism 72 is continuous with the adjacent conformal portions 68 of the free surface 69 of the adhesive 68. The walls or sides 73 of the cusps or prisms 72 are spaced away from the adjacent particles 16 by gaps 74 which increase in the direction of the reflective surface 20T. Stated differently, the walls 73 of the cusps or prisms 72 are highly inclined relative to each other and to the adjacent particles or spheres 16, are highly inclined relative to and are not perpendicular to the reflective surface 20T, and are highly inclined and are not parallel to light 50b directed at the cell 12 generally perpendicularly to the reflective surface 20T.

The terminus of each cusp or prism 72 approaches, but is spaced from, the reflective surface 20T. A space or chamber-like volume 78 is therefore defined by the walls 73 of each cusp or prism 72, the particles 16 adjacent thereto and the reflective surface 20T.

Preferably, the free surface 64 of the film 62 is and remains flat, meaning smooth and non-rough, regardless of the non-planar configuration assumed by the cell 12 and the cover 14. In this manner, the cover 14 is less likely to retain dirt or pollutants. Dirt and pollutants which adhere to the flat free surface 64 are easy to remove therefrom. In forming the conformal adhesive portions 68 and the cusps or prisms 72, as described above, the free surface 64 of the film 62 is preferably maintained flat.

The cover 14, like the cell 12, is flexible. As the cell 12 assumes various configurations, the free surface 64 of the film 62 remains essentially parallel to the reflective surface 20T of the first foil 20. Moreover, the walls 73 of the cusps or prisms 72 maintain the above-described relationships with the adjacent particles or spheres 16, the reflective surface 20T and the light 50b, etc. during flexing of the cell 12 and its cover 14. As a consequence, whether or not the cell 12 assumes a non-planar configuration, the layer 60, and particularly the cusps 72 of the irregular free surface 69, effect an increase in the efficiency of the cell 12.

Specifically, and continuing to refer to FIG. 2, the irregular free adhesive surface 69 of the cover 14 and the cusps or prisms 72 thereof function to direct otherwise "wasted" light 50b, etc. which would fall on the reflective surface 20T between adjacent particles or spheres 16 if the cover 14 was not present, onto the extending or upper portions of the adjacent particles or spheres 16.

The vertical or nearly vertical light 50b, etc. enters the film 62 through its free surface 64 from the ambient. The light 50b, etc. then vertically or nearly vertically traverses the adhesive 68 and then the cusps or prisms 72 and passes through the interfaces between the walls 73 of the cusps 72 and the spaces 78, as indicated at 82. The indices of refraction of the material of the adhesive 68 and of the spaces 78 are selected to cooperate with the highly inclined orientation of the walls 73 so that the light 50b, etc. is highly refracted at the interfaces 82 as shown in FIG. 2.

The highly refracted light 50b, etc. passes through the gap 74 along the wall 73 of the cusp or prism 72 proximate to one of the adjacent particles 16 and impinges non-perpendicularly on the reflective surface 20T. From the reflective surface 20T, the light 50b, etc. is non-perpendicularly reflected through the gap 74 along the wall 73 of the cusp or prism 72 proximate to the other adjacent particle 16 until it impinges on the portion 31 of such other adjacent particle 16.

The amount of refraction which occurs at the interfaces 82 depends in part on the index of refraction of the spaces 78. The spaces 78 may contain air. Because constant exposure of the cell 12 to moisture may be deleterious to its operation, the air in the spaces 78 may be dry, or appropriate moisture getters may be included in the spaces 78. Other gaseous or liquid substances, or polymers, which will not deleteriously affect the cell 12, may be included in the spaces 78 to selectively affect the refraction of the light 50b, etc. The spaces 78 may also be partially evacuated.

The efficiency increase effected by the cover 14 has been measured to be about 25% for a given amount of light 50 incident on the cell 12. The cover 14 of FIG. 2 causes an apparent increase of more than 10% in the diameters of the particles or spheres 16 when viewed from its free surface 64, which translates into an increase of more than 21% in the projected area of the particles 16 leading to a concomitant increase in electrical output. This apparent increase results in the increased efficiency of the cell 12 due to the increased amount of light 50b, etc. entering the spheres 16.

Figure 3:
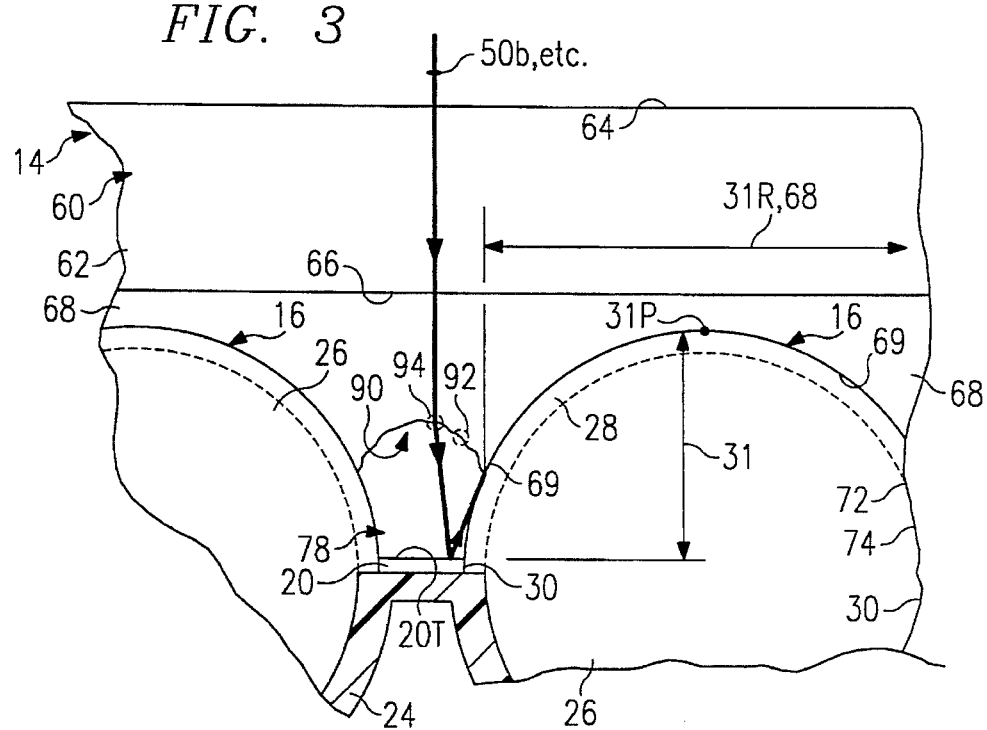
FIG. 3 illustrates a cover according to the present invention which is an alternative to that depicted in FIG. 2.
Figure 4:
FIG. 4 is an enlarged photograph of a section of a portion of a solar cell pursuant to FIG. 3 having thereon a cover according to the present invention.

The placement of the cover 14 on the cells 12 may result in the formation of concave cusps or prims 90 rather than the convex cusps or prisms 72. Such concave cusps 90 are depicted in FIGS. 3 and 4. In the event of concave cusp 90 formation, the spaces 78 are bounded by the reflective surface 20T and the walls 92 of the cusps 90. As with the previous embodiment, if the spaces 78 contain a vacuum or a light-transparent gaseous, liquid or solid substance, the refractive index of which has an appropriate relationship to the refractive indices of the adhesive 68, some of the light 50b, etc. will be prevented from being wasted and will enter the particles 16. In the photograph of FIG. 4, the second foil 22 and the insulative coating 24 are absent.

Specifically, light 50b, etc. generally perpendicular to the separation between adjacent particles 16 will, upon passing through a cusp wall 92-space 78 interface 94, change direction from nearly vertical to a path generally aimed at the particle 16 to which the light 50b, etc. was closer. The directionally altered light then is reflected from the surface 20T and into the closer particle 16. As will be recalled, the cusps or prisms 72 effected direction of light 50b, etc. entering a space 78 nearer to one particle 16 into another, adjacent particle 16. Thus, the cusps or prisms 72 and the cusps or prims 90 are functional equivalents, even though each directs the otherwise wasted light 50b, etc. along different paths. In both embodiments, the free surface 69 of the adhesive 68 between adjacent particles 16 is not perpendicular to the vertical or nearly vertical light 50b, etc. which is, accordingly, diffracted within the space 78 for non-normal reflection by the surface 20T into a particle 16.

Those skilled in the art will appreciate that numerous other embodiments and equivalents of those disclosed are within the purview of the foregoing description and are covered by the following claims. Such persons will also appreciate that both the angular relationship of the walls 73,92 to the direction of the wasted light 50b, etc. and the refractive indices of the cusps 72 or concavities 90 may be adjusted to achieve various increases in the efficiency of the cell 12.

What is claimed is:

1. A photovoltaic cell having a cover, the cell including a plurality of spaced semiconductor particles having portions extending away from a reflective surface so that the particle portions are exposed to radiant energy directed at the cell; a substantial amount of the radiant energy which impinges on the reflective surface between adjacent particle portions being wasted due to its being reflected so as to not fall upon the particle portions, the cover comprising:

a layer of radiant energy-transparent material having a free surface and an opposed surface on which is a radiation energy-transparent adhesive having a free surface, first portions of the free surface of said adhesive conforming to the polar regions of adjacent particle portions, and second portions of the free surface of said adhesive between the pole-conforming portions thereof extending toward the reflective surface and having surfaces which are non-perpendicular to the direction of the otherwise wasted radiant energy, spaces being defined between the second portions and the reflective surface;

both (a) the angular relationship between the surfaces of the second portions and the otherwise wasted radiant energy and (b) the refractive indices of the adhesive and the spaces being such that a significant amount of the otherwise wasted radiant energy which passes through the layer of energy-transparent material, the adhesive and each adhesive-space interface between adjacent particles is reflected by the reflective surface onto the particle portions.

2. A combination as in claim 1, wherein:

the second portions are prism-like projections.

3. A combination as in claim 2, wherein:

the second portions are convexities.

4. A combination as in claim 2, wherein:

the second portions are concavities.

5. A combination as in claim 2, wherein:

the radiant energy is refracted at each projection-space interface and the path taken by the refracted radiant energy is generally along the projection proximate to one of the adjacent particles, onto the reflective surface, and then away from the reflective surface along the projection proximate to another adjacent particle, and then onto the extending portion of such other adjacent particle.

6. A combination as in claim 2, wherein:

the radiant energy is refracted at each projection-space interface and the path taken by the refracted radiant energy is generally along and proximate to one of the adjacent particles, onto the reflective surface, and then away from the reflective surface onto the extending portion of such one particle.

7. A combination as in claim 2 for a solar cell in which the reflective surface occupies approximately 20% of the cell area, wherein:

the cover increases the efficiency of the cell by about 25% for a given amount of radiant energy incident on the cell.

8. A combination as in claim 1, wherein:

the cover optically magnifies the apparent diameters of the particles as viewed from the free surface of the layer.

9. A combination as in claim 8, wherein:

the particles are semiconductor spheres or spheroids having diameters of between about 25 mils to about 45 mils;

the reflective surface occupies about 20% of the cell area;

the cover is about 4½ mils thick; and the magnification is about 10%.

10. A combination as in claim 1, wherein:

the reflective surface is a surface of a flexible member which holds the particles; and the cover is flexible.

11. A combination as in claim 10, wherein:

the particles are semiconductor spheres or spheroids.

12. A combination as in claim 1, wherein:

the cell is flexible, and the free surface of the cover and the reflective surface are spaced apart substantially uniformly over the areas of both thereof regardless of the configuration assumed by the cell upon flexing.

13. A combination as in claim 1, wherein:

the free surface of the cover is configured so as to not attract and retain significant amounts of particulate matter from the ambient.

14. A combination as in claim 13, wherein:

the free surface of the cover is substantially smooth.

15. A combination as in claim 1, wherein:

the cover optically magnifies the apparent diameters of the particles as viewed from the free surface of the cover by about at least 10%.

16. A combination as in claim 1, wherein:

the spaces are evacuated.

17. A combination as in claim 1, wherein:

the spaces contain a substance.

18. A combination as in claim 17, wherein:

the substance is a gas.

19. A combination as in claim 18, wherein:

the gas is air.

20. A combination as in claim 17, wherein:

the substance is substantially free of water vapor.

21. A combination as in claim 17, wherein:

the substance is a liquid.

22. A combination as in claim 17, wherein:

the substance is a solid.

23. A combination as in claim 1, wherein:

the material of the layer of energy-transparent material is a fluoropolymer; and the adhesive is ethylene vinyl acetate.

24. A combination as in claim 23, wherein:

the fluoropolymer is TEFZEL® film.

25. A combination as in claim 24, wherein:

the fluoropolymer is about 1½ mils thick and the adhesive is about 3 mils thick before its free surface is rendered irregular.

26. A method of producing a photovoltaic cell having a cover, the cell including a plurality of spaced semiconductor particles having portions extending away from a reflective surface so that the particle portions are exposed to radiant energy directed at the cell; a substantial amount of the radiant energy which impinges on the reflective surface between adjacent particles being wasted due to its being reflected so as to not fall upon the particle portions, the method comprising:

(a) contacting the polar regions of the particles with the free surface of an adhesive residing on a layer of a material, the adhesive and the layer both being radiant energy-transparent; and (b) configuring the free surface of the adhesive to assume an irregular configuration so that (i) first portions thereof conform to the polar regions of adjacent particle portions and second portions thereof between the pole-conforming portions extend toward the reflective surface and have surfaces which are non-perpendicular to the otherwise wasted radiant energy and (ii) spaces are defined between the surfaces of the second portions and the reflective surface;

(c) both (i) the angular relationship between the surfaces of the second portions and the otherwise wasted radiant energy and (ii) the refractive indices of the adhesive and the spaces being such that a significant amount of the otherwise wasted radiant energy which passes through the layer, the adhesive and each adhesive-space interface between adjacent particles is reflected by the reflective surface onto the particle portions.

27. A method as in claim 26, wherein:

the configuring step is effected by the application of heat and/or force to the layer and/or the adhesive.

28. A method as in claim 26, wherein:

the reflective surface is a surface of a flexible member which holds the particles, the cell being flexible and conformal as a consequence, and the cover is similarly flexible and conformal.

29. A method as in claim 26 wherein:

the particles are semiconductor spheres or spheroids.

30. A method as in claim 26, wherein:

the free surface of the layer and the reflective surface are spaced apart substantially uniformly over the areas of both thereof regardless of the configuration assumed by the cell.

31. A method as in claim 26, wherein:

the free surface of the layer is configured so as to not attract and retain ambient particulate matter.

32. A method as in claim 31, wherein:

the free surface of the layer is substantially smooth.

33. A method as in claim 26, wherein:

the reflective surface occupies approximately 20% of the cell area, and the cover increases the efficiency of the cell by about 25% for a given amount of radiant energy incident on the cell.

34. A method as in claim 26, wherein:

the second portions are prism-like projections.

35. A method as in claim 34, wherein:

the second portions are concavities.

36. A method as in claim 34, wherein:

the second portions are convexities.

37. A method as in claim 26, which further comprises:

evacuating the spaces.

38. A method as in claim 26, which further comprises:

filling the spaces with a substance.

39. A method as in claim 38, wherein:

the substance is a gas, a liquid or a solid.

40. A method as in claim 39, wherein:

the substance is air.

41. A method as in claim 38, wherein:

the substance is substantially free of water.

42. A method as in claim 26, wherein:

the layer is a fluoropolymer and the adhesive is ethylene vinyl acetate.

43. A method as in claim 42, wherein:

the fluoropolymer is TEFZEL® film.

44. A photovoltaic cell made by the method of claim 26.

* * * * *